(12) United States Patent
Hwang

(10) Patent No.: US 8,518,831 B2
(45) Date of Patent: Aug. 27, 2013

(54) METHOD OF FORMING SEMICONDUCTOR MEMORY DEVICE

(75) Inventor: Young Sun Hwang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 118 days.

(21) Appl. No.: 13/310,943

(22) Filed: Dec. 5, 2011

(65) Prior Publication Data

US 2012/0142194 A1 Jun. 7, 2012

(30) Foreign Application Priority Data

Dec. 6, 2010 (KR) .................. 10-2010-0123623

(51) Int. Cl.
*H01L 21/311* (2006.01)
(52) U.S. Cl.
USPC .................................. 438/703; 257/E21.249
(58) Field of Classification Search
USPC .............................................. 438/445, 703
See application file for complete search history.

(56) References Cited

U.S. PATENT DOCUMENTS

| | | | | |
|---|---|---|---|---|
| 7,115,525 B2 * | 10/2006 | Abatchev et al. | ............. | 438/725 |
| 7,790,531 B2 * | 9/2010 | Tran | ............... | 438/157 |
| 7,943,481 B1 * | 5/2011 | Kim | ............... | 438/424 |
| 8,026,179 B2 * | 9/2011 | Lue | ............... | 438/703 |
| 8,148,247 B2 * | 4/2012 | Juengling | ............... | 438/585 |
| 2009/0317748 A1 * | 12/2009 | Choi | ............... | 430/312 |

FOREIGN PATENT DOCUMENTS

KR 1020090042458 A 4/2009

* cited by examiner

*Primary Examiner* — William D Coleman
(74) *Attorney, Agent, or Firm* — William Park & Associates Patent Ltd.

(57) ABSTRACT

A method of forming semiconductor memory device includes forming first to fourth spacers over a target layer including a first region and second regions adjacent to the first region so that a first spacer group including the first spacers spaced at a first interval is formed in the first region of the target layer, a second spacer group including the second spacers spaced at second intervals is formed in the second regions, a third spacer is formed between the first and the second spacer groups, and fourth spacers are formed between the third spacer and the first spacer group; forming an overlap pattern blocking the target layer; and forming first patterns, spaced at the first interval and each formed to have a first width, in the first region and second patterns, spaced at the second intervals and each formed to have a second width, in the second regions.

25 Claims, 13 Drawing Sheets

METHOD OF FORMING SEMICONDUCTOR MEMORY DEVICE

CROSS-REFERENCE TO RELATED APPLICATION

Priority is claimed to Korean patent application number 10-2010-0123623 filed on Dec. 6, 2010, the entire disclosure of which is incorporated herein by reference in its entirety.

BACKGROUND

Exemplary embodiments relate generally to a method of forming a semiconductor memory device and, more particularly, to a method of forming a semiconductor memory device, which forms patterns of different line widths at the same time.

Patterns forming a semiconductor device are formed using a photolithography process. The photolithography process includes a process of forming a photoresist layer on a target layer and a process of forming photoresist patterns by exposing and developing the photoresist layer. The exposed regions of the target layer are removed by using an etch process employing the photoresist patterns as an etch mask. The target layer is a material layer for the patterns of the semiconductor device or a hard mask layer formed on the material layer for the patterns of the semiconductor device.

If the target layer is the hard mask layer, a process of removing the exposed regions of the material layer for the patterns of the semiconductor device by using an etch process employing hard mask patterns, formed by etching the hard mask layer, as an etch mask is further performed.

When the patterns of the semiconductor device are formed by performing a series of the processes, an interval between the patterns and the width of each pattern are determined by an interval between the photoresist patterns and the width of each photoresist pattern. However, the exposure resolution limit may cause a limitation of the interval between the photoresist patterns and the width of each photoresist pattern. In order to overcome the exposure resolution limit, spacer patterning technology using spacers as an etch mask is being developed.

A process of forming the spacers includes a process of forming partition patterns on the target layer, a process of forming a spacer layer on a surface of the partition patterns, a process of etching a portion of the spacer layer to expose the partition patterns, and a process of removing the exposed partition patterns. In this case, since the width of each of the spacers formed by a series of the processes is determined by a deposition thickness of the spacer layer, the exposure resolution limit can be overcome and the photoresist patterns can be finely formed.

If the patterns of the semiconductor device are formed using the spacer patterning technology, the patterns can be formed finer than the exposure resolution limit because the width of each of the patterns is identical with the width of the spacer.

However, each of patterns formed in a specific region of the semiconductor device has a greater width than the spacer. For example, in case of the gate lines of a NAND flash memory device, the gate lines include word lines formed in a memory cell region and select lines formed in a select transistor region. In general, the word lines are formed to have finer line widths than the exposure resolution limit in order to improve the degree of high integration of semiconductor devices, and the select lines are formed to have wider widths than the word lines.

If the patterns of a semiconductor device are formed by using the spacers as an etch mask, however, the patterns of the semiconductor device have the same line width. Accordingly, there is a need for a method of forming patterns of different line widths (e.g., the word lines and the select lines) at the same time.

BRIEF SUMMARY

Exemplary embodiments relate to a method of forming semiconductor memory device which can form patterns of different line widths at the same time.

A method of forming semiconductor memory device according to an aspect of the present disclosure includes forming first to fourth spacers over a target layer including a first region and second regions adjacent to the first region so that a first spacer group including first spacers spaced apart from each other at a first interval is formed in the first region of the target layer, a second spacer group including second spacers spaced apart from one another at second intervals is formed in the second regions, a third spacer is formed between the first and the second spacer groups, and an odd number of fourth spacers are formed between the third spacer and the first spacer group; forming an overlap pattern blocking the target layer exposed between the third spacer and the first spacer group; and forming first patterns, spaced apart from each other at the first interval and each formed to have a first width, in the first region and second patterns, spaced apart from one another at the second intervals and each formed to have a second width, in the second regions by etching the target layer exposed between the first to fourth spacers and the overlap pattern.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
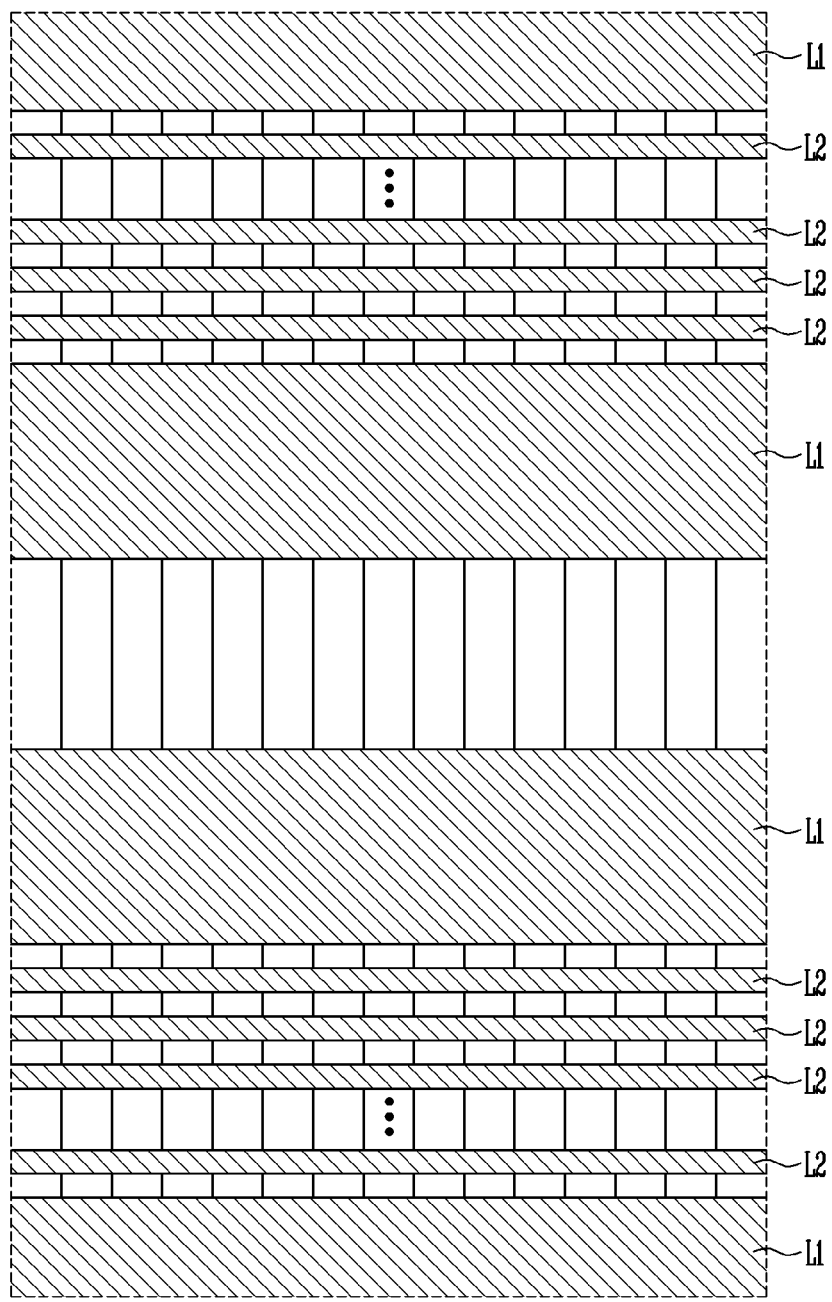
FIG. 1 is a diagram illustrating the layout of the patterns of a semiconductor memory device according to an embodiment of the present invention.

FIG. 1 is a diagram illustrating the layout of the patterns of a semiconductor memory device according to an embodiment of the present invention. In particular, FIG. 1 is a diagram illustrating the patterns of a semiconductor memory device which are formed by patterning the same material layer.

Referring to FIG. 1, first and second patterns L1 and L2 formed by patterning the same material layer may have different line widths. That is, each of the first patterns L1 may have a greater width than each of the second patterns L2. In particular, the second patterns L2 each having a relatively narrow width are repeatedly arranged at narrower intervals than the exposure resolution limit in order to improve the degree of high integration of semiconductor memory devices.

For example, in case of a NAND flash memory device, the first patterns L1 may be select lines formed in a select transistor region, and the second patterns L2 may be word lines formed in a memory cell region. A plurality of word lines L2 arranged between two adjacent select lines L1 may form a group, and a plurality of groups may be formed. The select lines L1 and the word lines L2 are, for example, parallel to each other. The word lines L2 are coupled to the gates of memory cells which form a cell string of the NAND flash memory device. The select lines L1 are coupled to the gate of a source select transistor for selecting a cell string or the gate of a drain select transistor.

An interval between the word lines L2 coupled to the memory cells may be set to be narrower than the exposure resolution limit in order to improve the degree of high integration of the devices. The drain select transistor and the source select transistor coupled to the select lines L1 have a different electrical characteristic from the memory cells. Furthermore, a contact plug is formed between adjacent select lines L1, e.g., at a boundary between the groups. Accordingly, an interval between the adjacent select lines L1 may be formed to be wider than the interval between the word lines L2 in order to secure a space where the contact plug is to be formed. Furthermore, in order to secure an electrical characteristic of the select lines L1, each select lines L1 may be formed to have a greater line width than the word line L2.

The word lines and the select lines of the NAND flash memory device have been described as the first and the second patterns L1 and L2, but the present invention is not limited thereto.

Figure 2A:
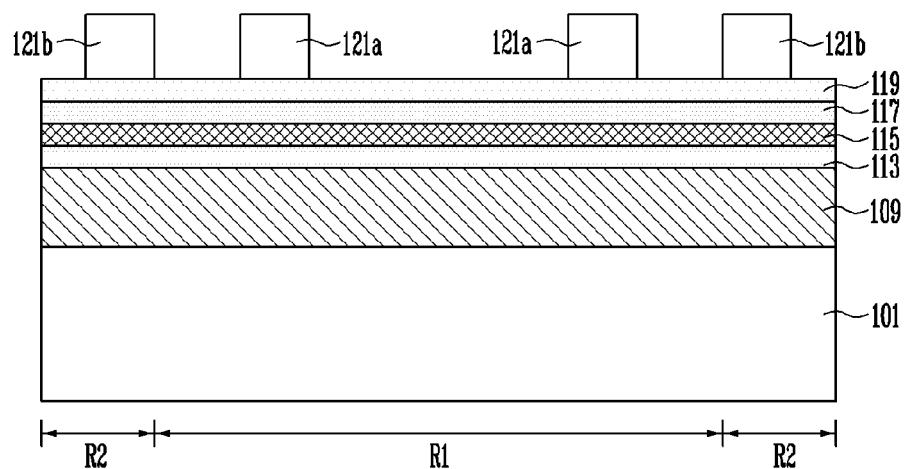
FIGS. 2A to 2H are cross-sectional views illustrating a method of forming the patterns of a semiconductor memory device using spacer patterning technology.

Referring to FIG. 2A, a target layer 109, including first regions R1 and second regions R2 spaced apart from each other, is formed over a semiconductor substrate 101. The first regions R1 arranged between each of the second regions R2. Here, the first region R1 has a wider width than each of the second patterns to be formed in the second regions R2. The first patterns are arranged at intervals wider than the second patterns and formed in the first region R1. The second region R2 is a region where the second patterns are formed to have narrow widths and narrow intervals in order to overcome the exposure resolution limit.

The target layer 109 may be a portion of the semiconductor substrate 101 or may be a stack layer including at least one layer formed over the semiconductor substrate 101. For example, the stack layer may be a single layer, such as a hard mask layer or a material layer for the semiconductor memory device, or a dual layer, including a material layer for the semiconductor memory device and a hard mask layer formed over the material layer. The material layer may be a single layer, such as an insulating layer or a conductive layer, or a multi-layer including an insulating layer and a conductive layer.

First to fourth auxiliary layers 113, 115, 117, and 119 are formed over the target layer 109. The first auxiliary layer 113 may be a material layer having a different etch selectivity from a material layer for spacers to be formed in a subsequent process. Also, the third auxiliary layer 117 may be a material layer having a different etch selectivity from a material layer for auxiliary spacers to be formed in a subsequent process. The second auxiliary layer 115 functions as an etch mask when the first auxiliary layer 113 is etched. Here, the second auxiliary layer 115 may be a material layer having a different etch selectivity from the first auxiliary layer 113. The fourth auxiliary layer 119 functions as an etch mask when the third auxiliary layer 117 is etched. Here, the fourth auxiliary layer 119 may be a material layer having a different etch selectivity from the third auxiliary layer 117.

For example, the material layer for the spacers and the material layer for the auxiliary spacers may be formed of an oxide layer. The first auxiliary layer 113 may be formed of amorphous carbon. The second auxiliary layer 115 may be formed of SiON. The third auxiliary layer 117 may be formed of amorphous carbon, and the fourth auxiliary layer 119 may be formed of Undoped Silicate Glass (USG).

Next, first and second photoresist patterns 121a and 121b are formed on the fourth auxiliary layer 119 by using a photolithography process employing an exposure mask. The first photoresist patterns 121a are formed on the fourth auxiliary layer 119 corresponding to the first region R1. The second photoresist patterns 121b are formed on the fourth auxiliary layer 119 corresponding to the second regions R2. An alignment error between the first and the second photoresist patterns 121a and 121b may not occur because an arrangement of the first and the second photoresist patterns 121a and 121b is determined according to blocked regions and exposed regions formed in the exposure mask. In order to improve the degree of high integration of the semiconductor memory devices, each of the first and the second photoresist patterns 121a and 121b is formed to have a minimum line width according to the exposure resolution limit.

According to an example, in order to form the alignment margin of an exposure mask when overlap patterns are subsequently formed, an interval between the first photoresist pattern 121a and the second photoresist pattern 121b is 4/3 of the width of the second photoresist pattern 121b. Furthermore, in order to form the second patterns with a uniform interval, an interval between adjacent second photoresist patterns 121b formed on the fourth auxiliary layer 119 corresponding to the second regions R2 is 5/3 of the width of the second photoresist pattern 121b, although not shown.

In addition, the number of first photoresist patterns 121a may vary according to the width of the first pattern to be formed. FIGS. 2A to 2H show an example where the width of the first pattern is four times the interval between the second patterns. In this case, the first photoresist pattern 121a has the same width as the second photoresist pattern 121b. The first photoresist patterns 121a are formed on the fourth auxiliary layer 119 corresponding to edges of both sides of the first region R1 so that the first patterns are formed to be adjacent to each other in the first region R1. Here, in order for the interval between the first patterns to be wider than the interval between the second patterns, the interval between the first photoresist patterns 121a is greater than the interval between the second photoresist patterns 121b in the first region R1.

Figure 2B:
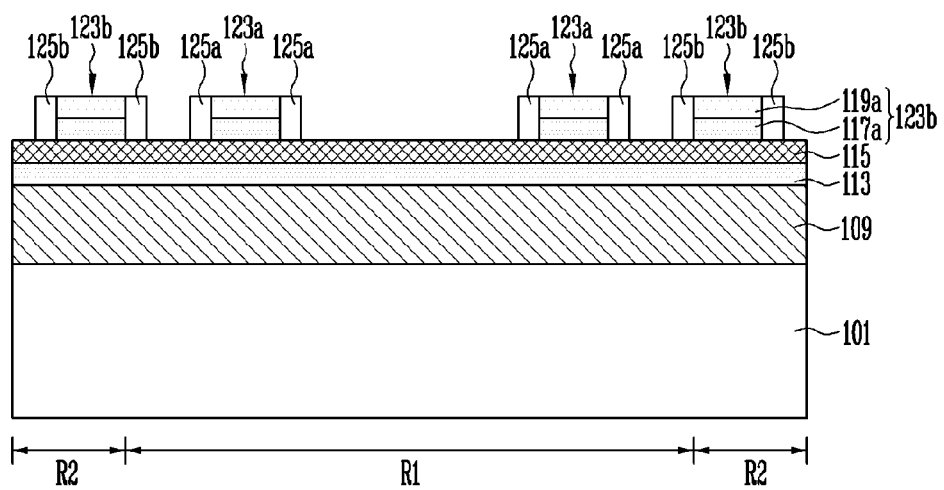

Referring to FIG. 2B, the exposed regions of the fourth auxiliary layer 119 are removed by using the first and the second photoresist patterns 121a and 121b of FIG. 2A as a mask. Next, the exposed regions of the third auxiliary layer 117 are removed. If the third auxiliary layer 117 is too thick and thus the third auxiliary layer 117 may not be used as a mask because the first and the second photoresist patterns 121a and 121b are removed when etching the exposed regions of the third auxiliary layer 117, the fourth auxiliary layer 119 may be used as a mask.

Consequently, first and second auxiliary partition patterns 123a and 123b, each having a stack structure of third and fourth auxiliary layers 119a and 117a remaining after the exposed regions of the third and the fourth auxiliary layers are etched, are formed. The first auxiliary partition patterns 123a formed on the lower side of the first photoresist patterns may have the same widths and intervals as the first photoresist patterns. The second auxiliary partition patterns 123b formed on the lower side of the second photoresist patterns may have the same widths and intervals as the second photoresist patterns. After the first and the second partition patterns 123a and 123b are formed, remaining first and second photoresist patterns are removed by a strip process.

Next, first auxiliary spacers 125a are formed on the sidewalls of the first partition patterns 123a, and second auxiliary spacers 125b are formed on the sidewalls of the second partition patterns 123b. The first and the second auxiliary spacers 125a and 125b are formed by depositing a material layer for the auxiliary spacers on a surface of the entire structure in which the first and the second auxiliary partition patterns 123a and 123b are formed and then etching the material layer by using a blanket etch process, such as etch-back, so that a top surface of the first and the second auxiliary partition patterns 123a and 123b is exposed.

According to an example, in order to form the second patterns with a uniform interval, the width of each of the first and the second auxiliary spacers 125a and 125b is formed to be ⅓ of the width of the second photoresist pattern or ⅓ of the width of the second auxiliary partition pattern 123b. The width of each of the first and the second auxiliary spacers 125a and 125b may become ⅓ of the width of the second auxiliary partition pattern 123b by controlling a deposition thickness of the material layer for the auxiliary spacers when the material layer for the auxiliary spacers is deposited. An interval between the first and the second auxiliary partition patterns 123a and 123b is ⅔ of the width of the second auxiliary partition pattern 123b, and the width of each of the first and the second auxiliary spacers 125a and 125b is ⅓ of the width of the second auxiliary partition pattern 123b. Thus, the width of an opening formed between the first and the second spacers 125a and 125b adjacent to each other is ⅔ of the width of the second auxiliary partition pattern 123b. Although not shown, since an interval between the second auxiliary partition patterns 123b is ⅔ of the width of the second auxiliary partition pattern 123b, the width of an opening formed between the second auxiliary partition patterns 123b is identical with the width of the second auxiliary partition pattern 123b.

Figure 2C:
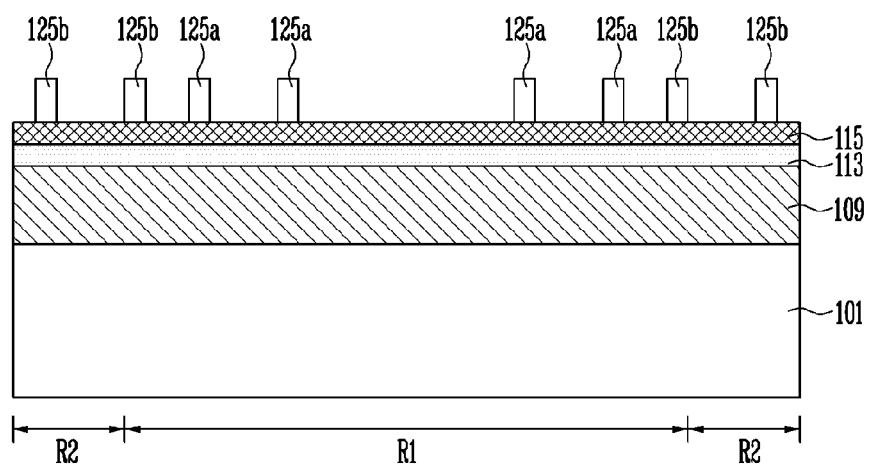

Referring to FIG. 2C, some regions of the second auxiliary layer 115, not overlapping with the first and the second auxiliary spacers 125a and 125b, are exposed by removing the first and the second auxiliary partition patterns 123a and 123b.

Figure 2D:
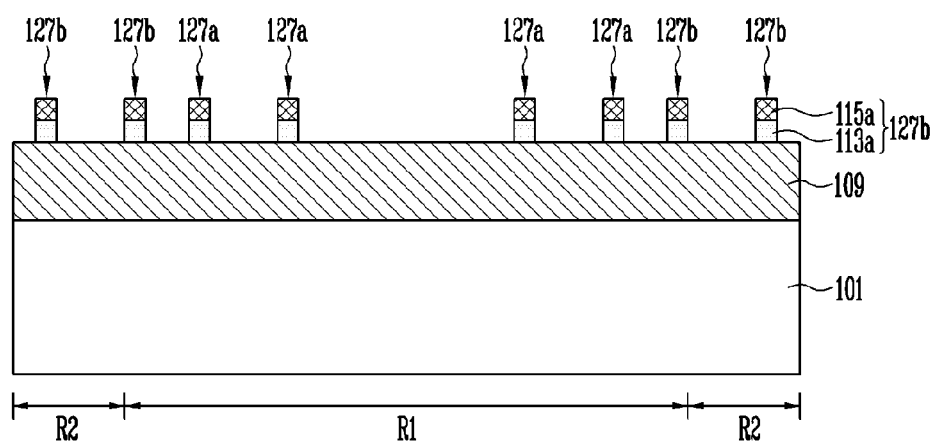

Referring to FIG. 2D, the exposed regions of the second auxiliary layer 115 are removed by using the first and the second auxiliary spacers 125a and 125b as an etch mask. Next, the exposed regions of the first auxiliary layer 113 are removed. If the first auxiliary layer 113 is too thick and thus the first and the second auxiliary spacers 125a and 125b may not be used as a mask because the first and the second auxiliary spacers 125a and 125b are removed when etching the exposed regions of the first auxiliary layer 113, the second auxiliary layer 115 may be used as a mask.

Consequently, first and second partition patterns 127a and 127b, each having a stack structure of the first and the second auxiliary layers 113a and 115a remaining after the exposed regions of the first and the second auxiliary layers are etched, are formed. The first partition patterns 127a formed the lower sides of the first auxiliary spacers 125a of FIG. 2C, respectively, have the same widths and intervals as the first auxiliary spacers 125a. The second partition patterns 127b formed under the second auxiliary spacers 125b of FIG. 2C, respectively, have the same widths and intervals as the second auxiliary spacers 125b. After the first and the second partition patterns 127a and 127b are formed, the first and the second auxiliary spacers are removed.

As a result of a series of the processes, an interval between the first partition pattern 127a and the second partition pattern 127b becomes twice the width of the first partition pattern 127a or the width of the second partition pattern 127b, and an interval between the second partition patterns 127b becomes triple the width of the first partition pattern 127a or the width of the second partition pattern 127b. Furthermore, an interval between the two first partition patterns 127a adjacent to the second partition pattern 127b becomes triple the width of the first partition pattern 127a or the width of the second partition pattern 127b.

Figure 2E:
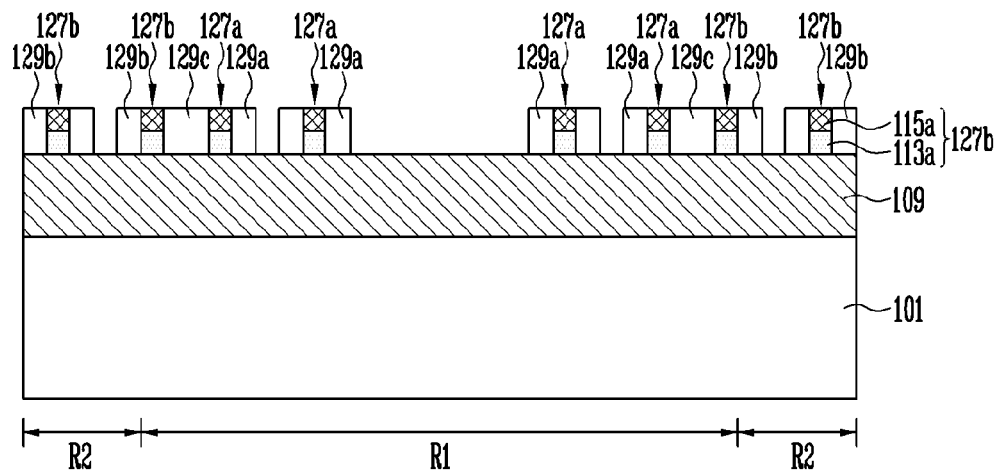

Referring to FIG. 2E, first spacers 129a are formed on the side walls of the first partition patterns 127a, and second spacers 129b are formed on the side walls of the second partition patterns 127b. The first and the second spacers 129a and 129b are formed by depositing a material layer for the spacers on a surface of the entire structure in which the first and the second partition patterns 127a and 127b are formed and then etching the material layer by using a blanket etch process, such as etch-back, so that a top surface of the first and the second partition patterns 127 and 127b is exposed.

In order to form the second patterns with a uniform interval, the width of each of the first and the second spacers 129a and 129b is identical with the width of the first partition pattern 127a or the second partition pattern 127b. The width of each of the first and the second spacers 129a and 129b may become identical with the width of the first partition pattern 127a or the second partition pattern 127b by controlling a deposition thickness of the material layer for the spacers when the material layer for the spacers is deposited.

The first and the second spacers are coupled between a space between the first and the second partition patterns 127a and 127b, each having a width twice greater than the width of the first partition pattern 127a or the second partition pattern, thus becoming third spacers 129c.

Figure 2F:
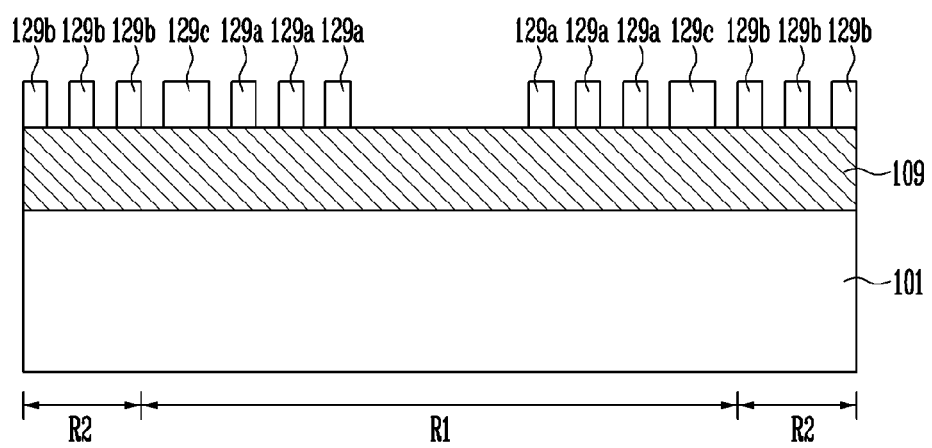

Referring to FIG. 2F, some regions of target layer 109, not overlapping with the first to third spacers 129a, 129b, and 129c, are exposed by removing the first and the second partition patterns 127a and 127b exposed in FIG. 2E.

Figure 2G:
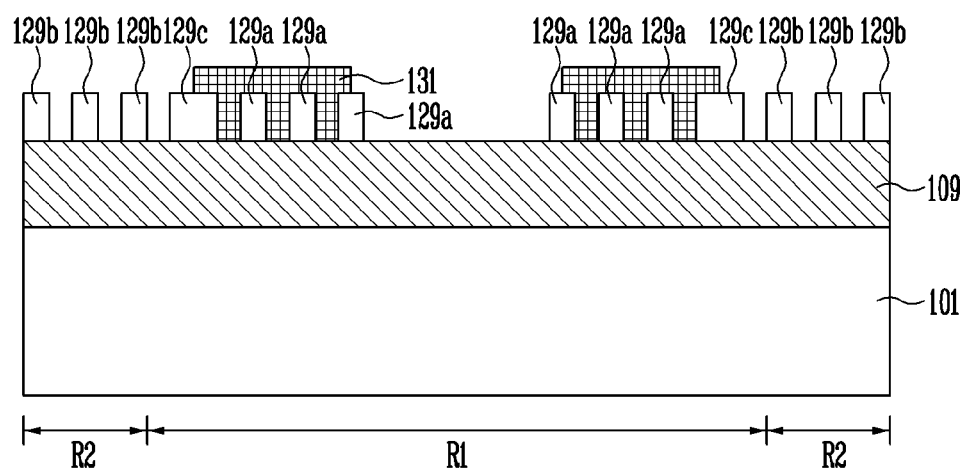

Referring to FIG. 2G, in order to form the first patterns each having a greater width than the second pattern, an overlap pattern 131, blocking the space between the third spacer 129c and the first spacer 129a and the space between the three first spacers 129a adjacent to the third spacer 129c, is formed. The overlap pattern 131 is a photoresist pattern formed by a photolithography process using an exposure mask.

An interval between the first to third spacers 129a, 129b, and 129c and the width of each of the first to third spacers 129a, 129b, and 129c are determined by, for example, a photolithography process and a deposition thickness of the material layer for the auxiliary spacers and the material layer for the spacers. Accordingly, an edge of one side of the first pattern corresponds to the edge of the third spacer 129c and an edge of the other side of the first pattern corresponds to the edge of the first spacer 129a so that the interval between the first patterns and the width of each of the first patterns are not different from predetermined values.

Also, an edge of one side of the overlap pattern 131 is arranged on a top surface of the third spacer 129c, and an edge of the other side of the overlap pattern 131, facing the edge of the top surface of the third spacer 129c, is arranged on a top surface of the first spacer 129a. In this case, since the edge of one side of the overlap pattern 131 is arranged on the top surface of the third spacer 129c wider than each of the first and the second spacers 129a and 129b, the overlap pattern 131 can have a sufficient alignment margin. The edge of the other side of the overlap pattern 131 is positioned according to the width of the overlap pattern 131.

Figure 2H:
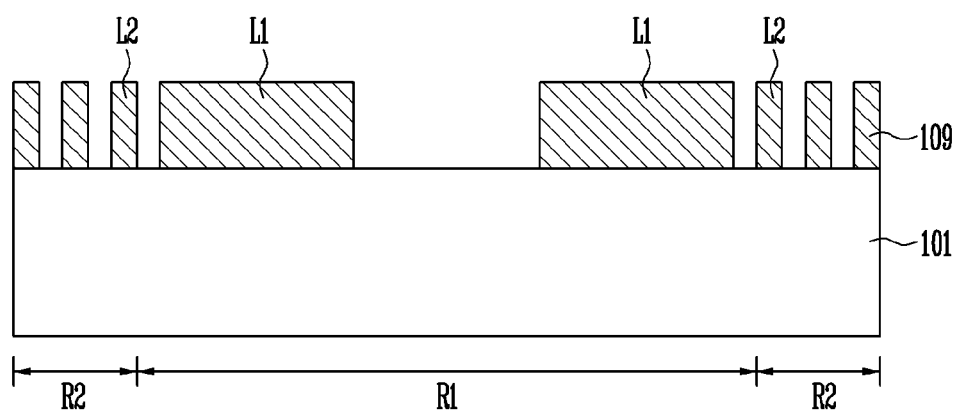

Referring to FIG. 2H, the exposed regions of the target layer 109 are removed by using the first to third spacers 129a, 129b, and 129c and the overlap patterns 131 in FIG. 2G, thereby forming the first patterns L1 and the second patterns L2. Each of the first patterns L1 has a first width under the overlap patterns 131 and the first and the third spacers 129a and 129c overlapping with the overlap patterns 131. The second patterns L2 have the same widths and the same intervals as the second spacers 129b, respectively, under the second spacers 129b.

Furthermore, each of the second patterns L2 has a second width narrower than the first width. As a result of the processes described with reference to FIGS. 2A to 2H, the width of each first pattern L1 is four times the interval between the second patterns L2, and an interval between the first pattern L1 and the second pattern L2 is the same as an interval between the second patterns L2. Furthermore, the interval between the first patterns L1 adjacent to each other is automatically adjusted to the interval between the first spacers not blocked by the overlap pattern.

Figure 3A:
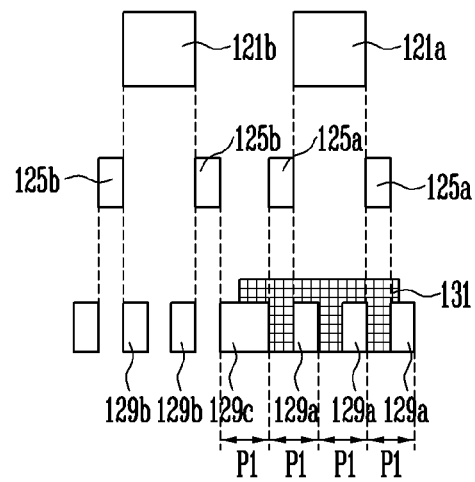
FIGS. 3A to 3C are diagrams illustrating line patterns having relatively wide patterns when the method of forming the patterns of the semiconductor memory device shown in FIGS. 2A to 2H is used.
Figure 3B:
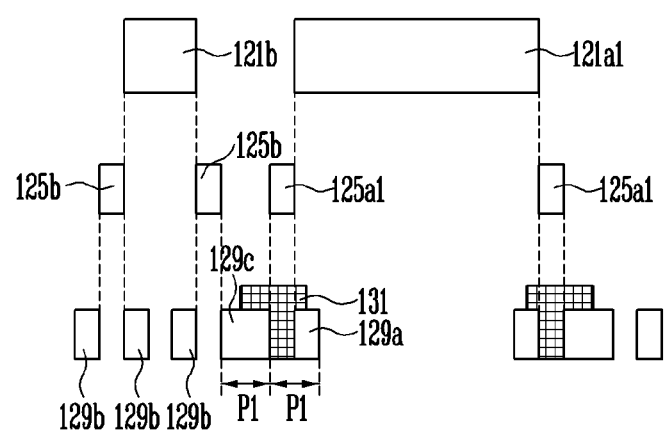
Figure 3C:
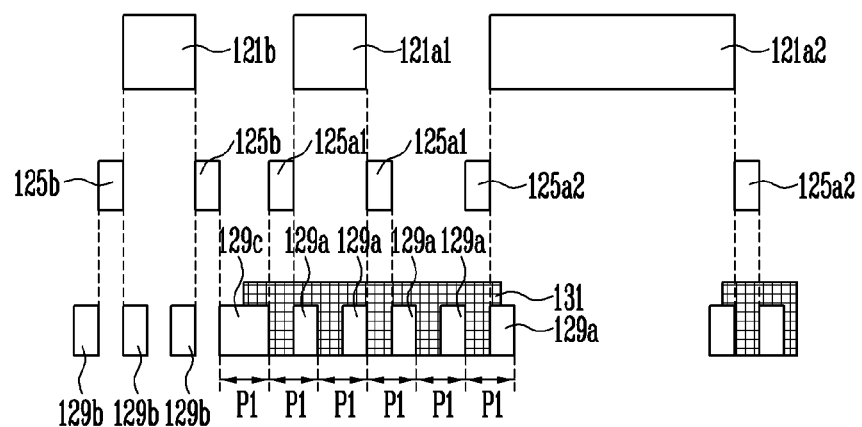

FIGS. 3A to 3C are diagrams illustrating line widths having relatively wide patterns when the method of forming the patterns of the semiconductor memory device shown in FIGS. 2A to 2H is used.

As described above with reference to FIG. 2A, one or more of first photoresist patterns may be formed on the fourth auxiliary layer, corresponding to the first region, according to the width of the first pattern to be formed. As shown in FIGS. 3A to 3C, however, in order to secure the alignment margin of overlap patterns 131 to be subsequently formed, an interval between a first photoresist pattern 121a, 121a1, or 121a2 formed on the fourth auxiliary layer, corresponding to the first region, and a second photoresist pattern 121b adjacent to the first photoresist pattern 121a, 121a1, or 121a2 is, for example, 4/3 of the line width of the second photoresist pattern 121b.

Furthermore, in order to form the first patterns with an interval greater than the interval between the second patterns, as shown in FIG. 3A, the first photoresist patterns 121a are formed at the edges of the first region, and an interval between the first photoresist patterns 121a formed on edges of both sides of the first region is formed to be greater than an interval between the second photoresist patterns 121b. In some embodiments, as shown in FIG. 3B, the first photoresist pattern 121a1 may be formed at the center of the top of the first region, and the width of the first photoresist pattern 121a1 is formed to be greater than the width of the second photoresist pattern 121b. In some embodiments, as shown in FIG. 3C, the first parts 121a1 of the first photoresist pattern may be formed on the edges of the first region, and the second part 121a2 of the first photoresist pattern is formed between the first parts 121a1. The second part 121a2 has a greater width than the second photoresist pattern 121b. An interval between the first part 121a1 and the second part 121a2 may be 5/3 of the width of the second photoresist pattern 121b. The width of the first photoresist pattern 121a of FIG. 3A and the width of the first part 121a1 of FIG. 3C is identical with the width of the second photoresist pattern 121b, having a minimum line width according to the exposure resolution limit, in order to finely control the width of the first pattern.

After the first and the second photoresist patterns 121a, 121a1, 121a2, and 121b are formed, in order to form the second patterns P1 with a uniform interval, first and second auxiliary spacers 125a, 125a1, 125a2, and 125b, each having a width that is 1/3 of the width of the second photoresist pattern 121b are formed by using a deposition process and an etch process for a material layer for auxiliary spacers. Next, in order to form the second patterns P1 with a uniform interval, first and second spacers 129a and 129b, each having the same width as each of the first and the second auxiliary spacers 125a, 125a1, 125a2, and 125b, are formed by a deposition process and an etch process for a material layer for spacers.

According to the constraint conditions of the processes, the number of first spacers 129a formed over the edge of one side of the first region may be increased or decreased every two as compared with FIG. 3A. Thus, the width of the first pattern may have only an even-numbered multiple of an interval between the second patterns P1. Accordingly, there is a need for a method of forming the patterns of a semiconductor memory device so that the width of the first pattern can have values of various ranges. In particular, there is a need for a method of forming the first pattern, having a width by one interval P1 smaller than the first pattern having the width four times the interval between the second patterns as shown in FIG. 3A.

According to an embodiment of the present invention, an interval between the second patterns can be finer than the exposure resolution limit and the width of the first pattern is greater than the interval P between the second patterns, but the width may have values of various ranges.

FIGS. 4A to 4H are cross-sectional views illustrating a method of forming the patterns of a semiconductor memory device according to an embodiment of the present invention. Furthermore, FIGS. 5A to 5C are cross-sectional views illustrating a method of forming the patterns of a semiconductor memory device according to an embodiment of the present invention. In particular, FIGS. 4A to 5C are cross-sectional views taken along line a direction crossing the first and the second patterns L1 and L2 shown in FIG. 1.

Figure 4A:
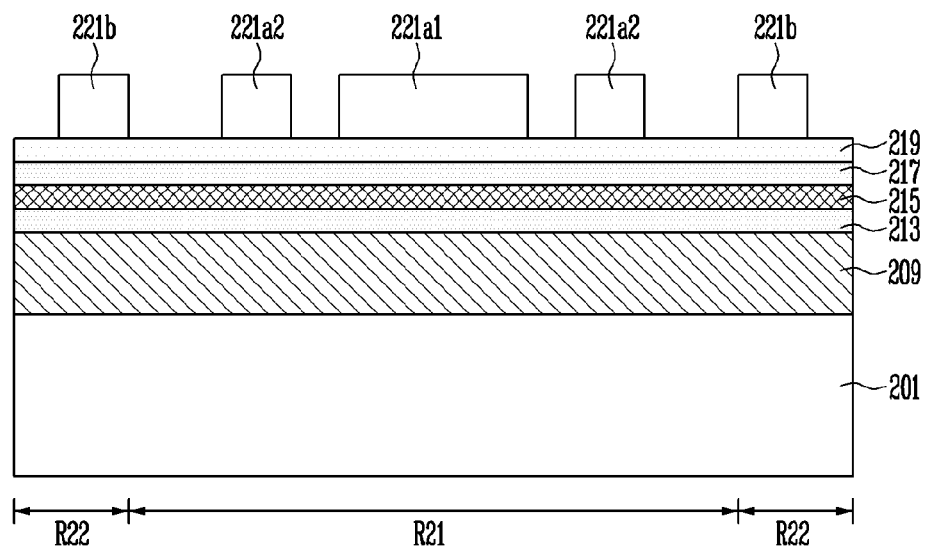
FIGS. 4A to 4H are cross-sectional views illustrating a method of forming the patterns of a semiconductor memory device according to an embodiment of present invention.
Figure 5A:
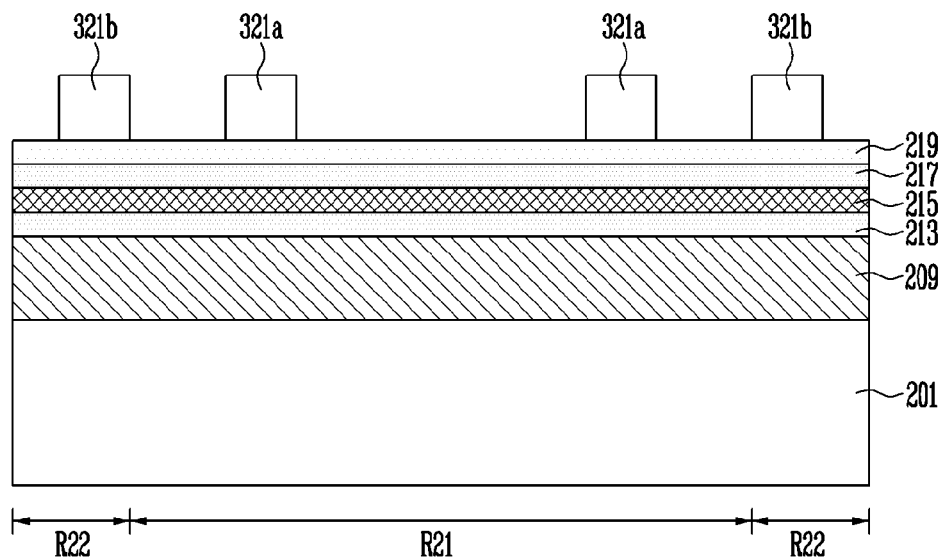
FIGS. 5A to 5C are cross-sectional views illustrating a method of forming the patterns of a semiconductor memory device according to an embodiment of the present invention.
Figure 5B:
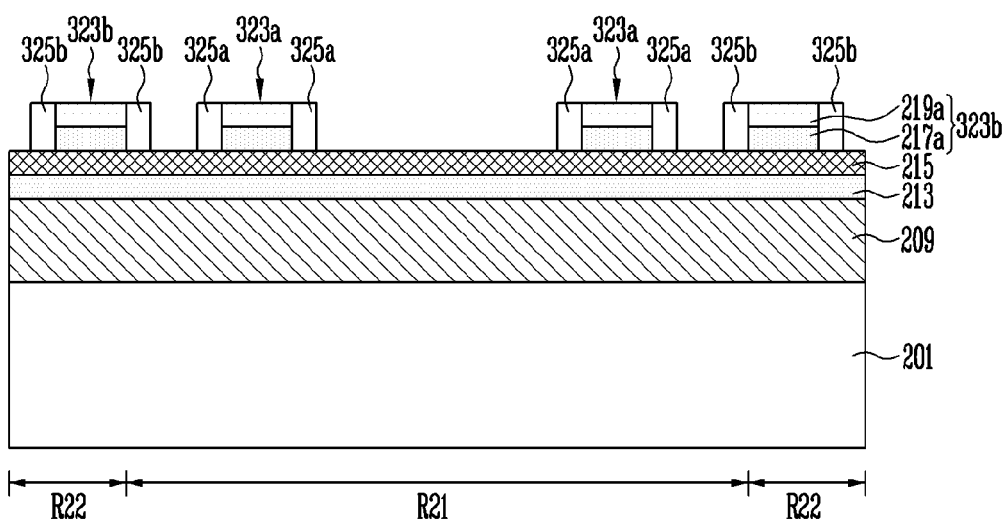
Figure 5C:
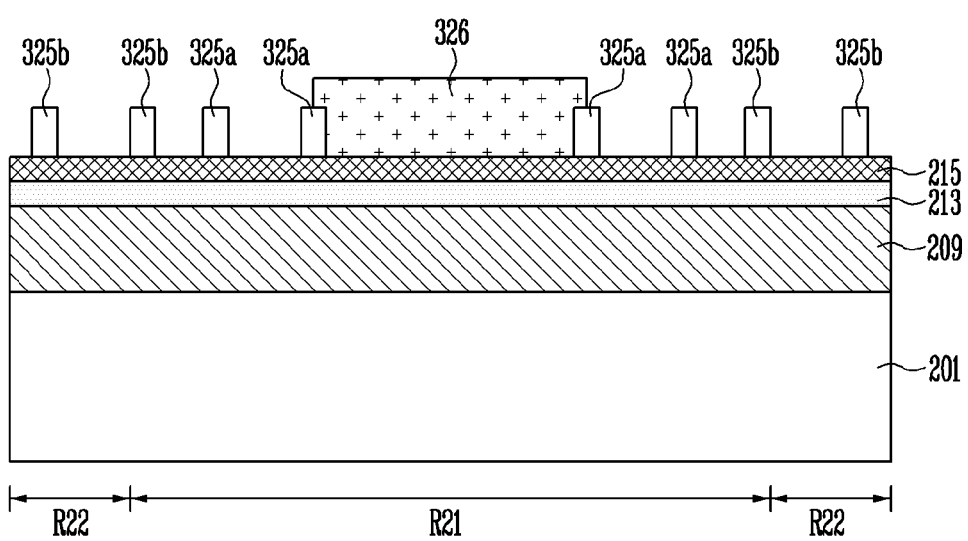

Referring to FIG. 4A, a target layer 209, including first regions R21 and second regions R22 spaced apart from each other, is formed over a semiconductor substrate 201. The first regions R21 arranged between each of the second regions R22. The first region R21 has a wider width than each of the second patterns to be formed in the second regions R22. The first patterns are arranged at intervals wider than the second patterns and formed in the first region R21. The second region R22 is a region where the second patterns are formed to have narrow widths and narrow intervals in order to overcome the exposure resolution limit.

The target layer 209 may be a portion of the semiconductor substrate 201 or may be a stack layer including at least one layer formed over the semiconductor substrate 201. For example, the stack layer may be a single layer, such as a hard mask layer or a material layer for the semiconductor memory device, or a dual layer, including a material layer for the semiconductor memory device and a hard mask layer formed over the material layer. The material layer may be a single layer, such as an insulating layer or a conductive layer, or a multi-layer including an insulating layer and a conductive layer.

First to fourth auxiliary layers 213, 215, 217, and 219 are formed over the target layer 209. The first auxiliary layer 213 may be a material layer having a different etch selectivity from a material layer for spacers to be formed in a subsequent process. The third auxiliary layer 217 may be a material layer having a different etch selectivity from a material layer for auxiliary spacers to be formed in a subsequent process. The second auxiliary layer 215 functions as an etch mask when the first auxiliary layer 213 is etched. Also, the second auxiliary layer 215 may be a material layer having a different etch selectivity from the first auxiliary layer 213. The fourth auxiliary layer 219 functions as an etch mask when the third auxiliary layer 217 is etched. Also, the fourth auxiliary layer 219 may be a material layer having a different etch selectivity from the third auxiliary layer 217.

For example, the material layer for the spacers and the material layer for the auxiliary spacers may be formed of an oxide layer. The first auxiliary layer 213 may be formed of amorphous carbon. The second auxiliary layer 215 may be formed of SiON. The third auxiliary layer 217 may be formed of amorphous carbon, and the fourth auxiliary layer 219 may be formed of Undoped Silicate Glass (USG).

Next, first to third photoresist patterns 221a1, 221a2, and 221b are formed on the fourth auxiliary layer 219 by using a photolithography process employing an exposure mask. The first photoresist patterns 221a1 are formed on the fourth auxiliary layer 219 corresponding to the first region R21. The second photoresist patterns 221a2 are formed on the fourth auxiliary layer 219 corresponding to the second regions R22. In particular, the first photoresist pattern 221a1 is formed at the center of the top of the first region R21, and arranged between each of the second photoresist patterns 221a2. The number of second photoresist patterns 221a2 formed between the first photoresist pattern 221a1 and the third photoresist patterns 221b is proportional to the width of each of first patterns to be formed subsequently.

An example where the width of the first pattern is triple the interval between second patterns to be formed subsequently is shown in FIGS. 4A to 4H. In this case, a second photoresist pattern 221a2 is formed between the first and the third photoresist patterns 221a1 and 221b. An alignment error may not occur between the first to third photoresist patterns 221a1, 221a2, and 221b because an arrangement of the first to third photoresist patterns 221a1, 221a2, and 221b is determined according to blocked regions and exposed regions formed in the exposure mask.

In order to improve the degree of high integration of semiconductor memory devices, each of the second and the third photoresist patterns 221a2 and 221b may have a minimum line width according to the exposure resolution limit. According to an example, the width of each of the second photoresist patterns 221a2 may be identical with the width of the third photoresist pattern 221b so that the width of the first pattern is identical with an interval between the second patterns. Furthermore, the width of the third photoresist pattern 221b may be greater than the exposure resolution limit. In this case, the width of the second photoresist pattern 221a2 may be $\frac{1}{3}$ of the width of the third photoresist pattern 221b. The width of the first photoresist pattern 221a1 is greater than the width of the third photoresist pattern 221b so that an interval between the first patterns is wider than an interval between the second patterns.

In order to form the second patterns with a uniform interval, the third photoresist patterns 221b have the same width, and an interval between the third photoresist patterns 221b may be $\frac{5}{3}$ of the width of the third photoresist pattern 221b, although not shown. According to an example, in order to secure the alignment margin of an exposure mask and also form the first pattern having a width odd-numbered multiple of an interval between the second patterns when auxiliary overlap patterns for determining an interval between the first patterns are subsequently formed, an interval between the first photoresist pattern 221a1 and the second photoresist pattern 221a2 adjacent to each other is $\frac{2}{3}$ of the width of the third photoresist pattern 221b. Furthermore, in order to secure the alignment margin of an exposure mask when overlap patterns for determining the widths of the first patterns are subsequently formed, an interval between the second photoresist pattern 221a2 and the third photoresist pattern 221b is $\frac{4}{3}$ of the width of the third photoresist pattern 221b.

If the plurality of second photoresist patterns 221a2 is formed between the first and the third photoresist patterns 221a1 and 221b, an interval between the second photoresist patterns 221a2 adjacent to each other is identical with an interval between the third photoresist patterns 221b so that the width of the first pattern is identical with the interval between the second patterns.

Referring to FIG. 5A, unlike FIG. 4A, first and second photoresist patterns 321a and 321b may be formed on a fourth auxiliary layer 219. The first photoresist patterns 321a are formed on the fourth auxiliary layer 219 corresponding to edges of both sides of the first region R21. The second photoresist patterns 321b are formed on the fourth auxiliary layer 219 corresponding to the second regions R22.

According to an example, an interval between the first photoresist pattern 321a and the second photoresist pattern 321b adjacent to each other is $\frac{4}{3}$ of the width of the second photoresist pattern 321b. Furthermore, in order to form second patterns with a uniform interval, an interval between the second photoresist patterns 321b adjacent to each other is $\frac{5}{3}$ of the width of the second photoresist pattern 321b, although not shown.

If the width of each of the first photoresist pattern 321a and the second photoresist pattern 321b has a minimum line width according to the exposure resolution limit in order to improve the degree of high integration of the semiconductor memory devices, the first photoresist pattern 321a and the second photoresist pattern 321b are formed to have the same width. Furthermore, an interval between the first photoresist patterns 321a is greater than an interval between the second photoresist patterns 321b.

Figure 4B:
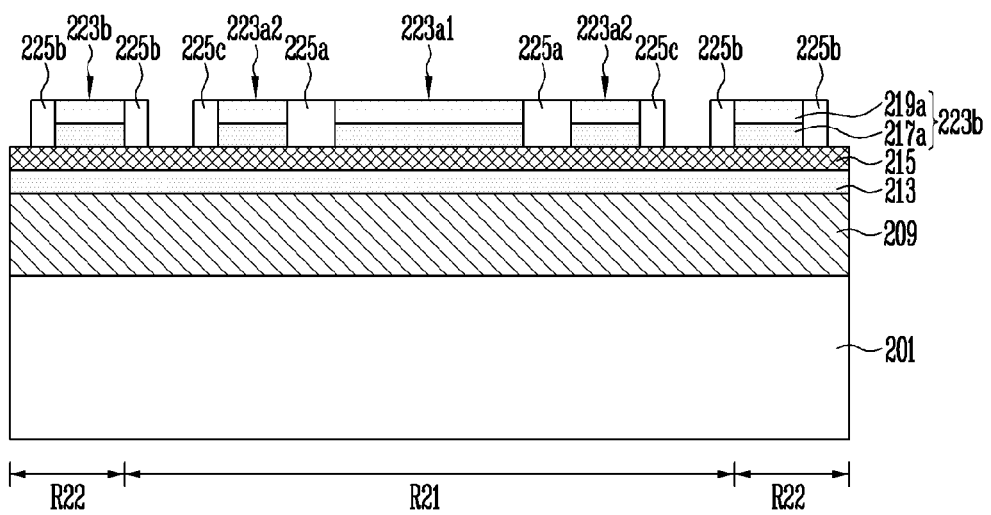

Referring to FIG. 4B, the exposed regions of the fourth auxiliary layer 219 are removed by using the first to third photoresist patterns 221a1, 221a2, and 221b of FIG. 4A as a mask. Next, the exposed regions of a third auxiliary layer 217 are removed. If the third auxiliary layer 217 is too thick and thus the first to third photoresist patterns 221a1, 221a2, and 221b may not be used as a mask because the first to third photoresist patterns 221a1, 221a2, 221b are removed when etching the exposed regions of the third auxiliary layer 217, the fourth auxiliary layer 219 may be used as a mask.

Third and fourth auxiliary layers 219a and 217a remaining after the exposed regions of the third and the fourth auxiliary layers are etched become first to third auxiliary partition patterns 223a1, 223a2, and 223b. The first auxiliary partition pattern 223a1 is formed to have the same width as the first photoresist pattern under the first photoresist pattern. The second auxiliary partition patterns 223a2 are formed to have the same widths and intervals as the second photoresist patterns under the second photoresist patterns, respectively. The third auxiliary partition patterns 223b are formed to have the same widths and intervals as the third photoresist patterns under the third photoresist patterns, respectively. That is, the first and the second auxiliary partition patterns 223a1 and 223a2 are formed in the first region R21, and the first auxiliary partition pattern 223a1 is arranged between each of the second auxiliary partitions 223a2.

Furthermore, according to an example, the first and the second auxiliary partition patterns 223a1 and 223a2 are spaced apart from each other at an interval of $\frac{2}{3}$ of the width of the third auxiliary partition pattern 223b. The width of the second auxiliary partition pattern 223a2 is identical with the width of the third auxiliary partition pattern 223b or is ⅓ of the width of the third auxiliary partition pattern 223b. The width of the first auxiliary partition pattern 223a1 is greater than the interval between the third auxiliary partition patterns 223b. The third auxiliary partition patterns 223b have the same width. Although not shown, the third auxiliary partition patterns 223b are spaced apart from each other at an interval of ⅗ of the width of the third auxiliary partition pattern 223b. The second auxiliary partition pattern 223a2 and the third auxiliary partition pattern 223b are spaced apart from each other at an interval of ⅘ of the width of the third auxiliary partition pattern 223b.

The first to third photoresist patterns remaining after the first to third auxiliary partition patterns 223a1, 223a2, and 223b are formed are removed by a strip process.

Next, after a material layer for auxiliary spacers is deposited on a surface of the entire structure in which the first to third auxiliary partition patterns 223a1, 223a2, and 223b are formed, the material layer for the auxiliary spacers is etched using a blanket etch process, such as etch-back process, so that a top surface of the first to third auxiliary partition patterns 223a1, 223a2, and 223b is exposed. Thus, first to third auxiliary spacers 225a, 225b, and 225c are formed.

Each of the first auxiliary spacers 225a is the material layer for the auxiliary spacers which is formed between the first auxiliary partition pattern 223a1 and the second auxiliary partition pattern 223a2. The second auxiliary spacers 225b are the material layers for the auxiliary spacers which remain on the sidewalls of the third auxiliary partition patterns 223b. Each of the third auxiliary spacers 225c is the material layer for the auxiliary spacers which remains on a sidewall on one side of the second auxiliary partition pattern 223a2 adjacent to the third auxiliary partition pattern 221b. The first auxiliary spacers 225a are spaced apart from each other and the first auxiliary partition pattern 223a1 is arranged between each of the first auxiliary spacers 225a. The second auxiliary spacers 225b are spaced apart from each other at an interval narrower than the width of the first auxiliary spacer 225a. Each of the second auxiliary spacers 225b has a narrower width than the first auxiliary spacer 225a. The third auxiliary spacer 225c has the same width as the second auxiliary spacer 225b between the first and the second auxiliary spacers 225a and 225b.

According to an example, in order to form the second patterns with a uniform interval, the width of the second auxiliary spacer 225b is ⅓ of the width of the third auxiliary partition pattern 223b. The width of the second auxiliary spacer 225b may be adjusted by controlling a deposition thickness of the material layer for the auxiliary spacers when the material layer for the auxiliary spacers is deposited. Each of the third auxiliary spacers 225c formed simultaneously with the second auxiliary spacers 225b has the same width as the second auxiliary spacer 225b.

Furthermore, the first and the second auxiliary partition patterns 223a1 and 223a2 are spaced apart from each other at an interval of ⅔ of the width of the third auxiliary partition pattern 223b, and thus the material layer for the auxiliary spacers is formed between the first and the second auxiliary partition patterns 223a1 and 223a2. Furthermore, the first auxiliary spacer 225a formed between the first and the second auxiliary partition patterns 223a1 and 223a2 fills the space between the first and the second auxiliary partition patterns 223a1 and 223a2 and has a width twice the width of the second or third auxiliary spacer 225b or 223c. In addition, an interval between the second and the third auxiliary partition patterns 223a2 and 223b is ⅘ of the width of the third auxiliary partition pattern 223b, and thus the width of an opening formed between the second and the third auxiliary spacers 225b and 225c is ⅔ of the width of the third auxiliary partition pattern 223b. Although not shown, the third auxiliary partition patterns 223b are spaced apart from one another at intervals of ⅗ of the width of the third auxiliary partition pattern 223b, and the width of a region not blocked by the second auxiliary spacer 225b between the third auxiliary partition patterns 223b is identical with the width of the third auxiliary partition pattern 223b.

Referring to FIG. 5B, unlike FIG. 4B, the exposed regions of the fourth auxiliary layer 219 are removed by using the first and the second photoresist patterns 221a and 221b of FIG. 5A as an etch mask. Next, the exposed regions of the third auxiliary layer 217 are removed. If the third auxiliary layer 217 is too thick and thus the first and the second photoresist patterns 221a and 221b may not be used as a mask because the first and the second photoresist patterns 221a and 221b are removed when etching the exposed regions of the third auxiliary layer 217, the fourth auxiliary layer 219 may be used as a mask.

Third and fourth auxiliary layers 219a and 217a remaining after the exposed regions of the third and the fourth auxiliary layers are etched become first and second auxiliary partition patterns 323a and 323b. The first and the second photoresist patterns remaining after the first and the second partition patterns 323a and 323b are removed by a strip process.

Next, first auxiliary spacers 325a are formed on the sidewalls of the first partition patterns 323a, and second auxiliary spacers 325b are formed on the sidewalls of the second partition patterns 323b. The first and the second auxiliary spacers 325a and 325b are formed by depositing a material layer for auxiliary spacers on a surface of the entire structure in which the first and the second auxiliary partition patterns 323a and 323b are formed and then etching the material layer for the spacers by using a blanket etch process, such as etch-back process, so that a top surface of the first and the second auxiliary partition patterns 323a and 323b is exposed.

The arrangement of the first and the second auxiliary partition patterns 323a and 323b and the width of each of the first and the second auxiliary partition patterns 323a and 323b are the same as the first and the second photoresist patterns of FIG. 5A.

Furthermore, according to an example, the first auxiliary spacers 325a are the material layers for the auxiliary spacers which remain on the sidewalls of each of the first auxiliary partition patterns 323a. The second auxiliary spacers 325b are the material layers for the auxiliary spacers which remain on the sidewalls of each of the second auxiliary partition patterns 323b. In order to form the second patterns with a uniform interval, the width of each of the first and the second auxiliary spacers 325a and 325b is ⅓ of the width of each of the first and the second auxiliary partition patterns 323a and 323b. The width of each of the first and the second auxiliary spacers 325a and 325b may be adjusted by controlling a deposition thickness of the material layer for the auxiliary spacers when the material layer for the auxiliary spacers is deposited.

Figure 4C:
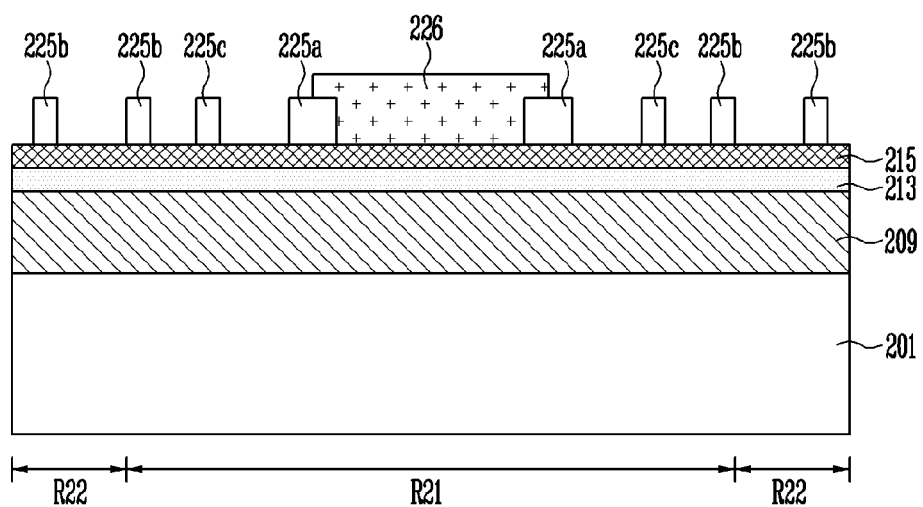

Referring to FIG. 4C, some regions of the second auxiliary layer 215 not overlapping with the first to third auxiliary spacers 225a, 225b, and 225c are exposed by removing the first to third auxiliary partition patterns 223a1, 223a2, and 223b exposed in FIG. 4B. Next, an auxiliary overlap pattern 226 blocking the space between the first spacers 225a is formed. The auxiliary overlap pattern 226 is a photoresist pattern formed by a photolithography process using an exposure mask. In particular, the auxiliary overlap pattern 226 may be formed simultaneously with a photoresist pattern for blocking a peripheral region where circuit elements for driving the semiconductor memory device are to be formed.

The edges of the auxiliary overlap pattern 226 are formed on the top surfaces of the first auxiliary spacers 225a, each having a greater width than each of the second and the third auxiliary spacers 225b and 225c. Accordingly, the alignment margin of the auxiliary overlap pattern 226 can be secured.

Referring to FIG. 5C, unlike FIG. 4C, some regions of the second auxiliary layer 215 not overlapping with the first and the second auxiliary spacers 325a and 325b are exposed by removing the first and the second auxiliary partition patterns 323a and 323b exposed in FIG. 5B. Furthermore, an auxiliary overlap pattern 326 that blocks the second auxiliary layer 215 between the first auxiliary partition patterns in FIG. 5B is formed. The auxiliary overlap pattern 326 is a photoresist pattern formed by a photolithography process using an exposure mask. In particular, the auxiliary overlap pattern 326 may be formed simultaneously with a photoresist pattern for blocking a peripheral region where circuit elements for driving the semiconductor memory device are to be formed.

Edges on both sides of the auxiliary overlap pattern 326 are formed on the top surfaces of the first auxiliary spacers 325a formed in the space between the first auxiliary partition patterns.

Figure 4D:
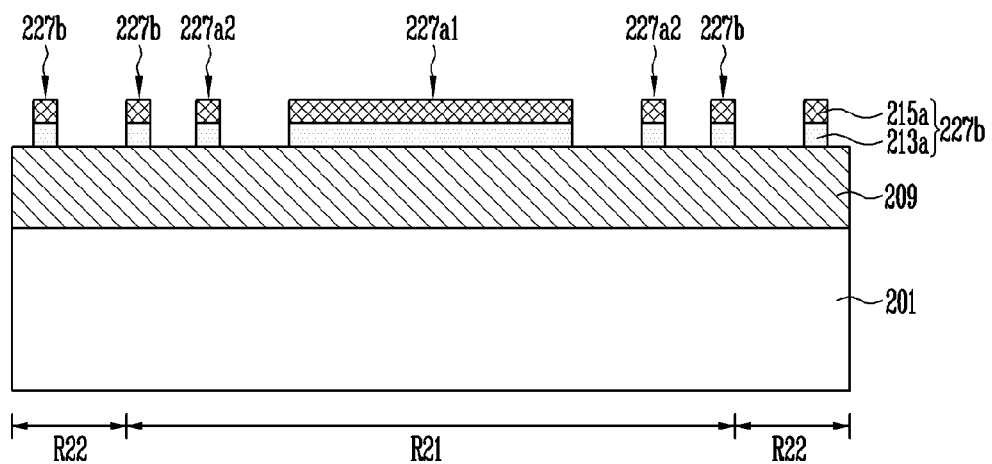

Referring to FIG. 4D, the exposed regions of the second auxiliary layer 215 are removed by using the first to third auxiliary spacers 225a, 225b, and 225c of FIG. 4C and the auxiliary overlap pattern 226 as a mask. Next, the exposed regions of the first auxiliary layer 213 are removed. In addition, unlike FIG. 4D, the exposed regions of the second auxiliary layer 215 may be removed by using the first and the second auxiliary spacers 325a and 325b of FIG. 5C and the auxiliary overlap pattern 326 as an etch mask. Next, the exposed regions of the first auxiliary layer 213 are removed.

If the first auxiliary layer 213 is too thick and thus the first to third auxiliary spacers 225a, 325a, 225b, 325b, and 225c and the auxiliary overlap patterns 226 and 326 may not be used as a mask because the first to third auxiliary spacers 225a, 325a, 225b, 325b, and 225c and the auxiliary overlap patterns 226 and 326 are removed when etching the exposed regions of the first auxiliary layer 213, the second auxiliary layer 215 may be used as a mask.

First and second auxiliary layers 213a and 215a remaining after the exposed regions of the first and the second auxiliary layers are etched become first to third partition patterns 227a1, 227a2, and 227b. The first partition pattern 227a1 is formed under the first auxiliary spacers 225a and the auxiliary overlap pattern 226 of FIG. 4C. The second partition patterns 227a2 are formed under the third auxiliary spacers 225c of FIG. 4C, respectively. The third partition patterns 227b are formed under the second auxiliary spacers 225b of FIG. 4C, respectively. An arrangement of the first to third partition patterns 227a1, 227a2, and 227b is determined according to an arrangement of the first to third auxiliary spacers 225a, 225b, and 225c and the auxiliary overlap pattern 226 of FIG. 4C.

In some embodiments, the first partition pattern 227a1 may be formed under the auxiliary overlap pattern 326 and the first auxiliary spacers 325a overlapping with the auxiliary overlap pattern 326 of FIG. 5C. The second partition patterns 227a2 may be formed under the first auxiliary spacers 325a, respectively, not overlapping with the auxiliary overlap pattern 326, from the first auxiliary spacers 325a of FIG. 5C. The third partition patterns 227b are formed under the second auxiliary spacers 325b of FIG. 5C, respectively. An arrangement of the first to third partition patterns 227a1, 227a2, and 227b is determined according to an arrangement of the first and the second auxiliary spacers 325a and 325b and the overlap pattern 326 of FIG. 5C.

According to the processes described with reference to FIGS. 4A to 4D or the processes described with reference to FIGS. 5A to 5C, the first partition pattern 227a1 is formed over the target layer 209 corresponding to the center of the first region R21. The first partition pattern 227a1 is arranged between the second partition patterns 227a2 over the target layer 209 corresponding to the first region R21. Furthermore, the third partition patterns 227b are formed over the target layer 209 corresponding to the second regions R22. After the first to third partition patterns 227a1, 227a2, and 227b are formed, the first to third auxiliary spacers and the auxiliary overlap pattern are removed. Thus, the first to third partition patterns 227a1, 227a2, and 227b are spaced apart from one another.

As a result of a series of the processes, each of an interval between the first partition pattern 227a1 and the second partition pattern 227a2 adjacent to each other and an interval between the third partition patterns 227b becomes triple the width of the second or third auxiliary spacer. That is, each of the interval between the first partition pattern 227a1 and the second partition pattern 227a2 adjacent to each other and the interval between the third partition patterns 227b becomes triple the width of each of the second and third partition patterns 227a2 and 227b. Furthermore, an interval between the second partition pattern 227a2 and the third partition pattern 227b adjacent to each other becomes twice the width of the second or third auxiliary spacer or becomes identical with the width of the second or third auxiliary spacer. That is, the interval between the second partition pattern 227a2 and the third partition pattern 227b adjacent to each other becomes twice the width of the second or third partition pattern 227a2 or 227b or becomes identical with the width of the second or third partition pattern 227a2 or 227b.

Figure 4E:
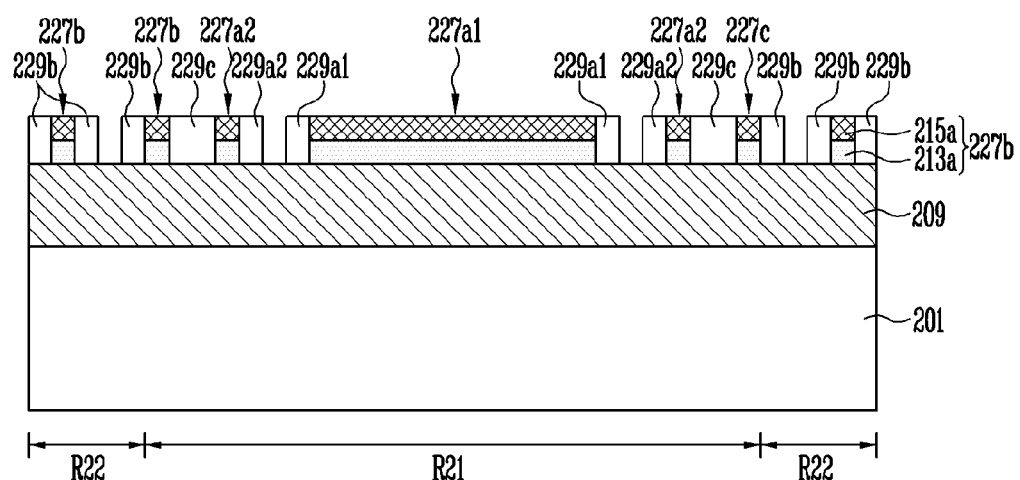

Referring to FIG. 4E, a material layer for spacers is deposited on a surface of the entire surface in which the first to third partition patterns 227a1, 227a2, and 227b are formed and then etched by using a blanket etch process, such as etch-back process, so that a top surface of the first to third partition patterns 227a1, 227a2, and 227b is exposed. Thus, first to fourth spacers 229a1, 229b, 229c, and 229a2 are formed.

The first spacers 229a1 are the material layers for the spacers which remain on both sides of the first partition pattern 227a1. The second spacers 229b are the material layers for the spacers which remain on the sidewalls of the third partition patterns 227b between the third partition patterns 227b. The third spacers 229c are the material layers for the spacers formed between the second partition patterns 227a2 and the third partition patterns 227b. The fourth spacers 229a2 are the material layers for the spacers which remain on sidewalls on one side of the second partition pattern 227a2 adjacent to the first partition pattern 227a1. The first spacers 229a1 are spaced apart from each other and the first partition pattern 227a1 is arranged between each of the first spacers 229a1. The second spacers 229b are spaced apart from one another at intervals each narrower than the width of the first spacer 229a1 on the target layer 209 corresponding to the second regions R22, respectively. Each of the third spacers 229c has a greater width than each of the first and the second spacers 229a1 and 229b between the first and the second spacers 229a1 and 229b. An odd number of the fourth spacers 229a2 are formed between the first spacer 229a1 and the third spacer 229c.

In order to form the second patterns with a uniform interval, each of the second spacers 229b has the same with as the third partition pattern 227b. The width of the second spacer 229b may be adjusted by controlling a deposition thickness of the material layer for the spacers when the material layer for the spacers is deposited. Each of the first and the fourth spacers 229a1 and 229a2 formed simultaneously with the second spacers 229b also has the same width as the second spacer 229b.

As a result of a series of the processes, a space between the second partition pattern 227a2 and the third partition pattern 227b has a width twice the width of the third partition pattern 227b or has the same width as the third partition pattern 227b. Accordingly, the space between the second partition pattern 227a2 and the third partition pattern 227b is filled with the material layer for the spacers, which has been deposited in the same thickness as the second partition pattern 227a2 on the sidewall of each of the second partition pattern 227a2 and the third partition pattern 227b. Furthermore, the third auxiliary spacer 229c formed between the second partition pattern 227a2 and the third partition pattern 227b adjacent to each other fills a space between the second partition pattern 227a2 and the third partition pattern 227b adjacent to each other and may have a width twice the width of the first, second, or fourth spacer 229a1, 229b, or 229a2 or have the same width as the first, second, or fourth spacer 229a1, 229b, or 229a2. Furthermore, an interval between the third partition patterns 227b is triple the width of the third partition pattern 227b, and the second spacer 229b has the same width as the third partition pattern 227b. Accordingly, the width of an opening formed between the second spacers 229b between the third partition patterns 227b is identical with the width of the third partition pattern 227b.

Furthermore, an interval between the first partition pattern 227a1 and the second partition pattern 227a2 adjacent to each other is triple the width of the third partition pattern 227b, and each of the first and the fourth spacers 229a1 and 229a2 has the same width as the third partition pattern 227b. Accordingly, the width of an opening formed between the first and the fourth spacers 229a1 and 229a2 is identical with the width of the third partition pattern 227b.

If the thickness of the material layer for the spacers is thick enough to be able to secure the alignment margin of overlap patterns to be formed in a subsequent process, the third auxiliary spacer 229c has the same width as the second spacer 229b.

Figure 4F:
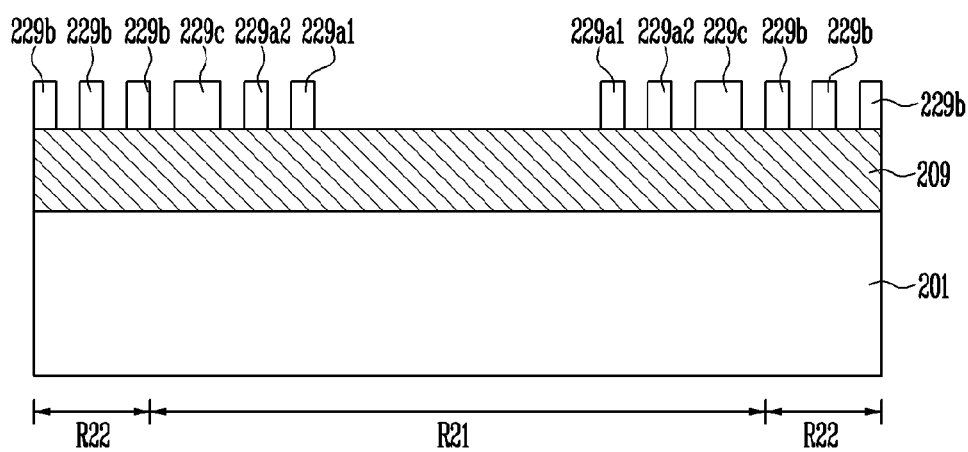

Referring to FIG. 4F, some regions of the target layer 209, not overlapping with the first to fourth spacers 229a1, 229b, 229c, and 229a2, are exposed by removing the first to third partition patterns 227a1, 227a2, and 227b exposed in FIG. 4E. Thus, all the first to fourth spacers 229a1, 229b, 229c, and 229a2 are spaced apart from one another. Here, the second spacers 229b are repeatedly arranged at uniform intervals. Furthermore, each of the first, second, and fourth spacers 229a1, 229b, and 229a2 has the same width as and the same interval between the second spacers 229b.

Figure 4G:
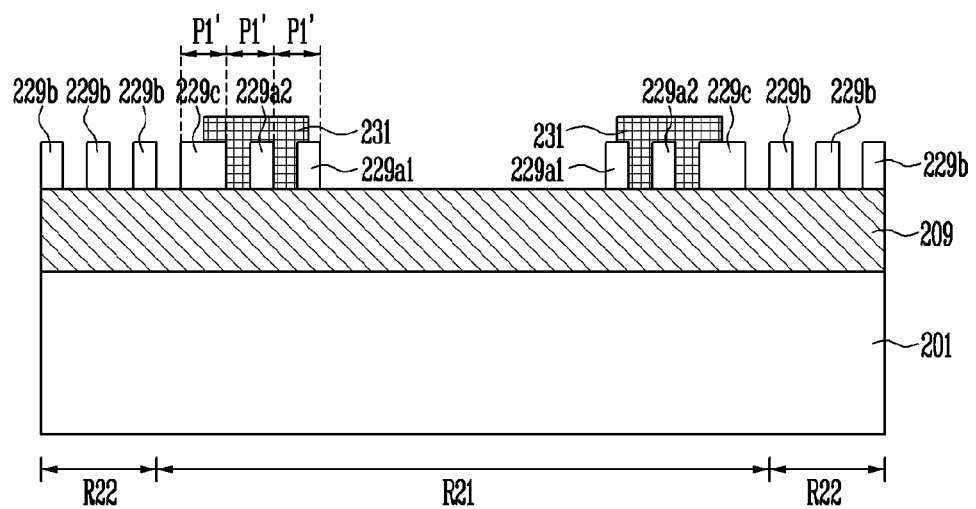

Referring to FIG. 4G, overlap patterns 231, each blocking some regions of the target layer 209 exposed between the first spacer 229a1 and the third spacer 229c, are formed. The overlap patterns 231 are photoresist patterns formed by using a photolithography process using an exposure mask.

If the deposition thickness of the material layer for the spacers is thin, the third auxiliary spacer 229c is formed to have a greater width than each of the first, second, and fourth spacers 229a1, 229b, and 229a2 by using the above process so that a sufficient alignment can be secured when the edges of the overlap pattern 231 are arranged on the top surfaces of the third auxiliary spacers 229c.

An interval between the first to fourth spacers 229a1, 229b, 229c, and 229a2 and the width of each of the first to fourth spacers 229a1, 229b, 229c, and 229a2 are determined by, for example, the photolithography process and the deposition thicknesses of the material layer for the auxiliary spacers and the material layer for the spacers. Accordingly, the edges of the first patterns are formed to correspond to the edges of the third spacers 229c so that an interval between the first patterns to be formed subsequently and the width of each first pattern are not different from predetermined values. In an embodiment of the present invention, the edges of the overlap patterns 231 are formed on the top surfaces of the third spacers 229c by securing the alignment margin of the overlap patterns 231. Accordingly, the edges of the first patterns are aligned to corresponding edges of the third spacers 229c in a subsequent process.

As a result of the processes of an embodiment of the present invention, if the width of the third spacer 229c is twice the width of the second spacer 229b, the width of each of the some regions of the target layer 209, blocked by the first, third, and fourth spacers 229a1, 229c, and 229a2 overlapping with the overlap patterns 231 and the overlap patterns 231, becomes triple the interval P1' between the second spacers 229b (that is, an odd-numbered multiple). Furthermore, if the third spacer 229c has the same width as the second spacer 229b, the width of each of the some regions of the target layer 209, blocked by the first, third, and fourth spacers 229a1, 229c, and 229a2 overlapping with the overlap patterns 231 and the overlap patterns 231, becomes about 2.5 times the interval P1' between the second spacers 229b.

Figure 4H:
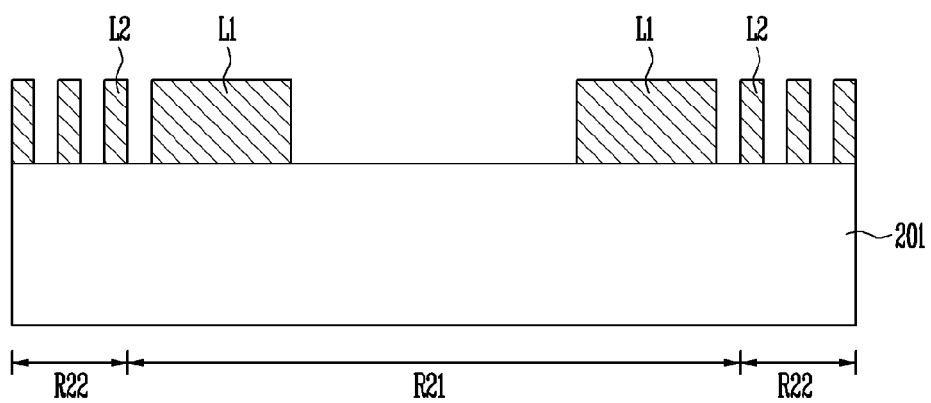

Referring to FIG. 4H, first patterns L1 and second patterns L2 are defined by removing the exposed regions of the target layer 209 by using the first to fourth spacers 229a1, 229b, 229c, and 229a2 and the overlap patterns 231 of FIG. 4G as a mask. The first patterns L1 are formed to have first widths, respectively, under the overlap patterns 231 and the first, third, and fourth spacers 229a1, 229c, and 229a2 overlapping with the overlap patterns 231. The second patterns L2 are formed to have the same widths and intervals as the second spacers 229b under the second spacers 229b, respectively. An interval between the first patterns L1 is wider than an interval between the second patterns L2. Furthermore, each of the second patterns L2 has the second width narrower than the first width.

As a result of the processes described with reference to FIGS. 4A to 4H, an interval between the first pattern L1 and the second pattern L2 adjacent to each other and an interval between the second patterns L2 is identical with the width of each of the first, second, and the fourth spacers. Furthermore, an interval between the first patterns L1 adjacent to each other is automatically adjusted to an interval between the first spacers not blocked by the overlap pattern. Furthermore, the width of each of the first patterns L1 may be triple the interval between the second patterns L2 or may be 2.5 times the interval between the second patterns L2.

According to an embodiment of the present invention, since an odd number of fourth spacers are formed between the first spacer and the third spacer adjacent to each other as a result of the processes described with reference to FIGS. 4A to 4H, the width of the first pattern L1 can be controlled so that it becomes a value other than an even-numbered multiple of the interval between the second patterns L2.

As described above, the first spacers spaced apart from each other at a first interval are formed on a portion of the target layer. The second spacers spaced apart from one another at second intervals are formed on a portion of the target layer. The third spacer is formed between the first spacer and the second spacer. The fourth spacer is formed between the first spacer and the third spacer. Next, the overlap pattern is formed to block some regions of the target layer exposed between the first spacer and the second spacers. Next, the exposed regions of the target layer are removed by using the first to fourth spacers and the overlap patterns as a mask. Accordingly, the patterns of different line widths can be formed at the same time.

Furthermore, according to an embodiment of the present invention, an odd number of fourth spacers are formed between the first spacer and the third spacer, and an interval between the first to fourth spacers and the width of each of the first to fourth spacers are controlled. Accordingly, patterns having relatively wide line widths can be formed with various widths, each greater than an interval between relatively narrow patterns.

What is claimed is:

1. A method of forming semiconductor memory device, comprising:
    forming first to fourth spacers over a target layer including a first region and second regions adjacent to the first region, wherein a first spacer group including the first spacers spaced apart from each other at a first interval is formed in the first region of the target layer, a second spacer group including the second spacers spaced apart from one another at second intervals is formed in the second regions, a third spacer is formed between the first and the second spacer groups, and an odd number of fourth spacers are formed between the third spacer and the first spacer group;
    forming an overlap pattern blocking the target layer exposed between the third spacer and the first spacer group; and
    forming first patterns and second patterns, wherein the first patterns are spaced apart from each other at the first interval and formed to have first widths in the first region, and the second patterns are spaced apart from one another at the second intervals and formed to have second widths in the second regions by etching the target layer exposed between the first to fourth spacers and the overlap pattern.

2. The method of claim 1, wherein each of the third spacers has an identical width with each of the first and second spacers or has a greater width than each of the first and second spacers.

3. The method of claim 1, wherein the first interval is wider than the second interval.

4. The method of claim 1, wherein the first width is greater than the second width.

5. The method of claim 1, wherein each of the first spacers, the second spacers, and the fourth spacers has the same width as the second interval.

6. The method of claim 1, wherein a width of each of the third spacers is twice a width of the second spacer.

7. The method of claim 1, wherein the second width and the second interval are identical with each other.

8. The method of claim 1, wherein an interval between the second spacer group and the third spacer is identical with the second interval.

9. The method of claim 1, wherein an interval between the first spacer group and the fourth spacer is identical with the second interval.

10. The method of claim 1, wherein an interval between the third spacer and the fourth spacer is identical with the second interval.

11. The method of claim 1, wherein an edge of the overlap pattern is formed on a top surface of the third spacer.

12. The method of claim 1, wherein forming the first to fourth spacers comprises:
    forming first to third partition patterns over the target layer, wherein the first partition pattern is arranged between the second partition patterns in the first region and the third partition patterns are arranged in the second regions;
    depositing a material layer for spacers on a surface of the first to third partition patterns;
    etching the material layer for the spacers to expose a top surface of the first to third partition patterns; and
    removing the first to third partition patterns.

13. The method of claim 12, wherein:
    the material layer for the spacers remaining on both sides of the first partition pattern becomes the first spacers,
    the material layer for the spacers remaining on sidewalls of the third partition patterns become the second spacers,
    the material layer for the spacers remaining between the second partition pattern and the third partition pattern become the third spacers, and
    the material layer for the spacers remaining on a sidewall of the second partition pattern on one side, adjacent to the first partition pattern, becomes the fourth spacers.

14. The method of claim 12, wherein forming the first to third partition patterns comprises:
    forming an auxiliary layer on the target layer;
    forming first to third auxiliary spacers on the auxiliary layer, wherein a first auxiliary spacer group including the first auxiliary spacers is formed in the first region, a second auxiliary spacer group including the second auxiliary spacers each having a narrower width than the first auxiliary spacer is formed in the second regions, and the third auxiliary spacer having an identical width with the second auxiliary spacer is formed in the first region between the first auxiliary spacer group and the second auxiliary spacer group;
    forming an auxiliary overlap pattern blocking the auxiliary layer exposed between the first auxiliary spacers;
    etching the auxiliary layer exposed between the first to third auxiliary spacers and the auxiliary overlap pattern; and
    removing the first to third auxiliary spacers and the auxiliary overlap pattern.

15. The method of claim 12, wherein forming the first to third partition patterns comprises:
    forming an auxiliary layer on the target layer;
    forming first and second auxiliary partition patterns over the auxiliary layer, wherein the first auxiliary partition patterns are formed in the first region and the second auxiliary partition patterns, spaced apart from one another at intervals narrower than the first auxiliary partition patterns and each formed to have an identical width with the first auxiliary partition pattern, are formed in the second regions;
    forming first and second auxiliary spacers over the auxiliary layer, wherein the first auxiliary spacers are formed on sidewalls of the first auxiliary partition patterns and the second auxiliary spacers each having an identical width with the first auxiliary spacer are formed on sidewalls of the second auxiliary partition patterns;
    removing the first and the second auxiliary partition patterns;
    forming an auxiliary overlap pattern blocking the auxiliary layer exposed between the first auxiliary spacers;
    etching the auxiliary layer exposed between the first and the second auxiliary spacers and the auxiliary overlap pattern; and removing the first and the second auxiliary spacers and the auxiliary overlap pattern.

16. The method of claim 14, wherein edges of the auxiliary overlap pattern are formed on a top surface of the first auxiliary spacers.

17. The method of claim 14, wherein:
the auxiliary layer remaining under the auxiliary overlap pattern and the first auxiliary spacers becomes the first partition pattern,
the auxiliary layer remaining under the third auxiliary spacers becomes the second partition patterns, and
the auxiliary layer remaining under the second auxiliary spacers become the third partition patterns.

18. The method of claim 14, wherein a width of each of the first auxiliary spacers is twice a width of each of the second and the third auxiliary spacers.

19. The method of claim 14, wherein a width of each of the second and the third auxiliary spacers is ⅓ of an interval between the second auxiliary spacers adjacent to each other.

20. The method of claim 14, wherein forming the first to third auxiliary spacers comprises:
forming first to third auxiliary partition patterns over the auxiliary layer, wherein the first auxiliary partition pattern is arranged between the second auxiliary partition patterns in the first region and the third auxiliary partition patterns are arranged in the second regions;
forming a material layer for the auxiliary spacers between the first and the second auxiliary partition patterns by depositing the material layer for the auxiliary spacers on a surface of the first to third auxiliary partition patterns;
etching the material layer for the auxiliary spacers to expose a top surface of the first to third auxiliary partition patterns; and
removing the first to third auxiliary partition patterns.

21. The method of claim 20, wherein:
the material layer for the auxiliary spacers formed between the first auxiliary partition pattern and the second auxiliary partition pattern becomes the first auxiliary spacer,
the material layer for the auxiliary spacers remaining on sidewalls of the third auxiliary partition patterns become the second auxiliary spacers, and
the material layer for the auxiliary spacers remaining on a sidewall of the second auxiliary partition pattern on one side, adjacent to the third auxiliary partition pattern, becomes the third auxiliary spacers.

22. The method of claim 15, wherein edges on both sides of the auxiliary overlap pattern overlap with a top surface of the first auxiliary spacers formed in a space between the first auxiliary partition patterns.

23. The method of claim 21, wherein a width of each of the first and the second auxiliary spacers is ⅓ of a width of each of the first and the second auxiliary partition patterns.

24. The method of claim 21, wherein an interval between the first auxiliary partition pattern and the second auxiliary partition pattern adjacent to each other is ⁴⁄₃ of a width of each of the second auxiliary partition patterns.

25. The method of claim 22, wherein:
the auxiliary layer remaining under the auxiliary overlap pattern and the first auxiliary spacers overlapping with the auxiliary overlap pattern becomes the first partition pattern,
the auxiliary layer remaining under the first spacers not overlapping with the auxiliary overlap pattern becomes the second partition patterns, and
the auxiliary layer remaining under the second auxiliary spacers becomes the third partition patterns.

* * * * *